(12) United States Patent
Borisevich et al.

(10) Patent No.: US 10,400,351 B2
(45) Date of Patent: Sep. 3, 2019

(54) BULK NANOFABRICATION WITH SINGLE ATOMIC PLANE PRECISION VIA ATOMIC-LEVEL SCULPTING OF CRYSTALLINE OXIDES

(71) Applicant: UT-Battelle, LLC, Oak Ridge, TN (US)

(72) Inventors: Albina Y. Borisevich, Knoxville, TN (US); Stephen Jesse, Knoxville, TN (US); Sergei V. Kalinin, Knoxville, TN (US); Andrew R. Lupini, Knoxville, TN (US); Raymond R. Unocic, Knoxville, TN (US); Qian He, Cardiff (GB)

(73) Assignee: UT-Battelle, LLC, Oak Ridge, TN (US)

( * ) Notice: Subject to any disclaimer, the term of this patent is extended or adjusted under 35 U.S.C. 154(b) by 0 days.

(21) Appl. No.: 15/697,541

(22) Filed: Sep. 7, 2017

(65) Prior Publication Data
US 2018/0066376 A1    Mar. 8, 2018

Related U.S. Application Data

(60) Provisional application No. 62/384,258, filed on Sep. 7, 2016.

(51) Int. Cl.
*C30B 1/00* (2006.01)
*H01J 37/317* (2006.01)
(Continued)

(52) U.S. Cl.
CPC ............ *C30B 1/00* (2013.01); *C30B 19/10* (2013.01); *C30B 29/02* (2013.01); *C30B 29/16* (2013.01);
(Continued)

(58) Field of Classification Search
CPC .......... C30B 19/10; C30B 1/00; C30B 29/02; C30B 29/16; C30B 29/32; C30B 30/00;
(Continued)

(56) References Cited

U.S. PATENT DOCUMENTS

2008/0258060 A1*  10/2008  Frosien ............... H01J 37/1478
250/310

OTHER PUBLICATIONS

Jesse et al, Small, Nov. 2015, 11, 5895-5900 and supporting information (Year: 2015).*

* cited by examiner

*Primary Examiner* — Hua Qi
(74) *Attorney, Agent, or Firm* — Warner Norcross + Judd LLP

(57) ABSTRACT

A method for sculpting crystalline oxide structures for bulk nanofabrication is provided. The method includes the controlled electron beam induced irradiation of amorphous and liquid phase precursor solutions using a scanning transmission electron microscope. The atomically focused electron beam includes operating parameters (e.g., location, dwell time, raster speed) that are selected to provide a higher electron dose in patterned areas and a lower electron dose in non-patterned areas. Concurrently with the epitaxial growth of crystalline features, the present method includes scanning the substrate to provide information on the size of the crystalline features with atomic resolution. This approach provides for atomic level sculpting of crystalline oxide materials from a metastable amorphous precursor and the liquid phase patterning of nanocrystals.

15 Claims, 4 Drawing Sheets

(51) Int. Cl.
*H01J 37/30* (2006.01)
*C30B 19/10* (2006.01)
*C30B 29/02* (2006.01)
*C30B 29/32* (2006.01)
*C30B 29/16* (2006.01)
*C30B 30/00* (2006.01)

(52) U.S. Cl.
CPC .............. *C30B 29/32* (2013.01); *C30B 30/00* (2013.01); *H01J 37/3005* (2013.01); *H01J 37/3174* (2013.01); *H01J 2237/31747* (2013.01)

(58) Field of Classification Search
CPC ......... H01J 2237/31747; H01J 37/3005; H01J 37/3174
See application file for complete search history.

BULK NANOFABRICATION WITH SINGLE ATOMIC PLANE PRECISION VIA ATOMIC-LEVEL SCULPTING OF CRYSTALLINE OXIDES

CROSS-REFERENCE TO RELATED APPLICATIONS

This application claims the benefit of U.S. Provisional Application 62/384,258, filed Sep. 7, 2016, the disclosure of which is hereby incorporated by reference in its entirety.

STATEMENT REGARDING FEDERALLY SPONSORED RESEARCH AND DEVELOPMENT

This invention was made with government support under Contract No. DE-AC05-00OR22725 awarded by the U.S. Department of Energy. The government has certain rights in the invention.

BACKGROUND OF THE INVENTION

The present invention relates to a method for sculpting three-dimensional crystalline oxide nanostructures with atomic level precision.

Progress in nanoscience has brought about advancements in the manipulation and control of matter at the nanometer and ultimately atomic level. Generally, a number of approaches for patterning have emerged, including parallel methods such as classical nanofabrication and serial methods based on electron beams or scanning probes. For example, the atomic manipulation of xenon atoms through Scanning Tunneling Microscopy (STM) by D. M. Eigler and E. K. Schweizer[1] in 1990 was a seminal achievement in nanotechnology and nanoscience, opening a new pathway for fabrication of atomic structures including quantum corrals,[2] standing electron waves,[3] atomic switches,[4] molecular cascades[5] for atomic based computing, and quantum holographic devices.[6] However, STM and Non-Contact Atomic Force Microscopy (NC-AFM) approaches for nano-manipulation[7,8] are necessarily limited to surface atomic structures. The combination of surface fabrication and slow throughput are severely limiting and this approach has largely been used for experimental devices and fundamental studies.

An alternative paradigm for patterning matter is offered by electron beams. Electron-beam lithography in Scanning Electron Microscope (SEM) geometry[9] is known to produce three dimensional structures at the nanometer scale. Due to the finite interaction volume for lower-energy electron beams, patterning at the atomic scale is not feasible and the typical minimal feature size is limited to tens of nanometers. In view of this shortcoming, there is interest in nanofabrication using highly energetic scanning transmission electron microscope beams. For example, it is known that scanning transmission electron microscope beams can induce hole formation in specimens via knock-on damage.[10] This effect can be used to form nanoscale patterns in thin amorphous films as well as single-layer graphene and few-layer graphene. Recently, atomic rearrangements in amorphous materials have been reported.[11] However, the lack of appropriate material systems and direct beam control on known scanning transmission electron microscope platforms have precluded practical implementations of bulk nanofabrication.

SUMMARY OF THE INVENTION

A method of sculpting crystalline oxide nanostructures with atomic level precision is provided. The method includes the controlled electron beam induced irradiation of amorphous and liquid phase precursor solutions using a scanning transmission electron microscope (STEM). The atomically focused electron beam includes operating parameters that are selected to provide a higher electron dose in patterned areas and a lower electron dose in non-patterned areas. Repeated scans of the electron beam in patterned areas promote epitaxial growth of three-dimensional crystalline structures. Concurrently with the epitaxial growth of crystalline structures, the present method includes scanning the substrate to provide information on the size of the crystalline structures with atomic resolution. This approach provides for atomic level sculpting of crystalline oxide materials from metastable amorphous precursors and liquid phase precursors.

In one embodiment, an amorphous precursor is positioned over a crystalline substrate for epitaxial growth of crystalline features as small as 1-2 nm. The atomically focused electron beam includes a location, a dwell time, and a raster speed that are selected to provide a higher electron dose in patterned areas and a lower electron dose in non-patterned areas. The present embodiment includes scanning the substrate to provide information on the size of the crystalline features with atomic resolution through electron energy loss spectroscopy (EELS).

In another embodiment, a liquid precursor includes a growth solution positioned within a liquid cell STEM holder. The atomically focused electron beam induces radiolysis in the growth solution, generating solvated electrons. The solvated electrons reduce the growth solution to create a crystalline nanostructure. The liquid precursor includes a growth solution of $H_2PdCl_4$ encapsulated between two electron-transparent silicon nitride membranes in the present embodiment, forming palladium nanocrystals, but can include other growth solutions in other embodiments as desired.

The present method makes possible the nanoscale additive fabrication of three-dimensional structures from amorphous precursors and liquid phase precursors. Non-patterned amorphous areas can be removed with differential etching or with a higher electron beam dose to destructively mill away the amorphous material. In addition to the bulk fabrication of three-dimensional crystalline oxides, the method of the present invention can be extended toward non-equilibrium systems and methods. For example, if dopants are patterned into the amorphous layer, the dopants can be incorporated into the growing crystal. In addition, dopants can exceed their solid solubility limit, allowing for the growth of nanostructures with unique properties.

These and other features and advantages of the present invention will become apparent from the following description of the invention, when viewed in accordance with the accompanying drawings and the appended claims. Before current embodiments are explained in further detail, it is to be understood that the invention is not limited to the details of operation set forth in the following description or illustrated in the drawings. The invention may be implemented in various other embodiments and of being practiced or being carried out in alternative ways not expressly disclosed herein.

DETAILED DESCRIPTION OF THE CURRENT EMBODIMENTS

Figure 1:
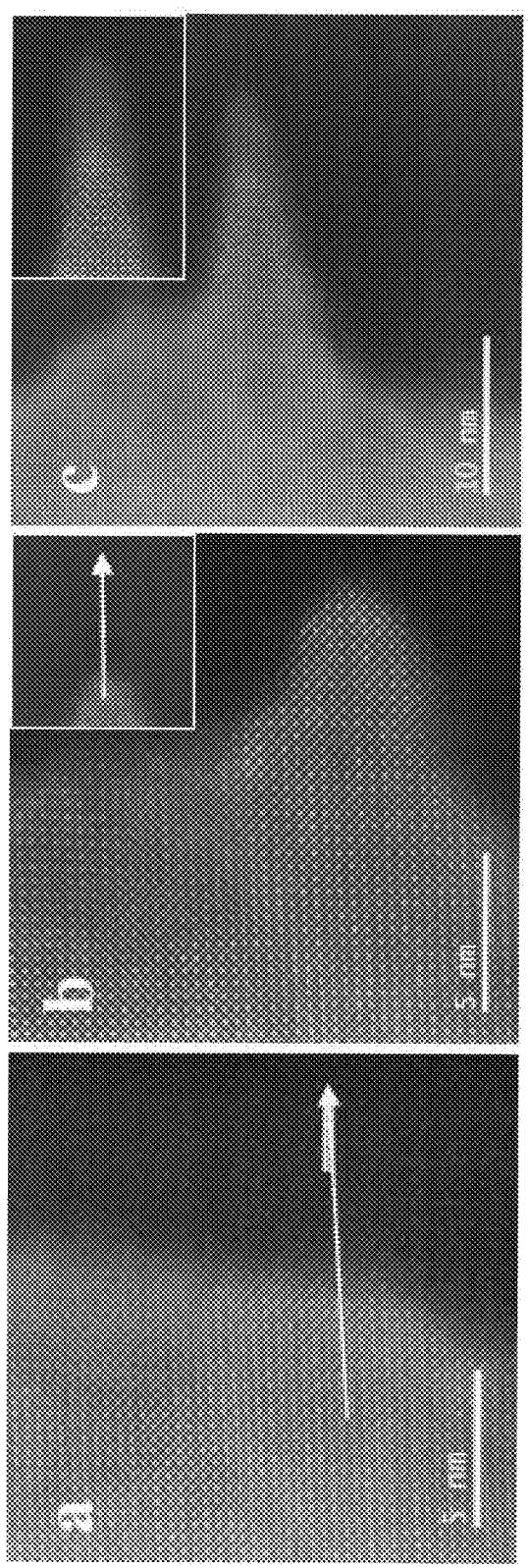
FIG. 1 indicates the area of a crystalline/amorphous boundary in FIB-milled $SrTiO_3$, with the direction of the subsequent EELS line trace shown by the arrow in part a, the view of the area after the line scan is complete in part b, and a larger view of the same area in part c showing incomplete crystallization at the end.

The current embodiments relate to a method for sculpting crystalline oxide structures for bulk nanofabrication and other applications. The method includes the controlled electron beam induced irradiation of amorphous or liquid phase precursors for the growth of crystalline features as small as 1-2 nm. A discussion of this method is set forth in Part I below, and working examples are set forth in Part II below.

I. METHOD FOR SCULPTING CRYSTALLINE OXIDE STRUCTURES

The method of the current embodiment includes disposing an amorphous solid precursor or a liquid state precursor in the sample area of a STEM. For amorphous solid precursors, the sample area can include a heterostructure having an amorphous solid deposited on a crystalline substrate. For example, the heterostructure can include an amorphous SrTiO$_3$ block atop a crystalline SrTiO$_3$ substrate. Strontium titanate is selected as an amorphous precursor in the current embodiment; however other oxide precursors can be used in other embodiments as desired, including other alkaline earth metal oxides. For a liquid state precursor, the sample area includes a growth solution positioned within a liquid cell STEM holder. For example, the liquid precursor includes a growth solution of H$_2$PdCl$_4$ encapsulated between two electron-transparent silicon nitride membranes for forming palladium nanocrystals, while other growth solutions can be used to form nanocrystals of other elements in other embodiments as desired.

The method of the current embodiment then includes activating the STEM probe and finely focusing and precisely controlling the operating parameters of a STEM probe over the sample area. Relevant operating parameters include the location, the dwell time, and the raster speed of the STEM probe. With a sufficiently slow scan speed, the method can be used to create epitaxial nanostructures of arbitrary shape. Suitable STEMs include the "Titan S" aberration-corrected scanning transmission electron microscope by FEI Thermo Fisher Scientific and the "UltraSTEM" aberration-corrected scanning transmission electron microscope by Nion Company. By applying a DC bias to the scanning STEM coils, the location, dwell time, and raster speed of the STEM probe is precisely controlled. Upon controllable electron beam irradiation from a sub-nanometer STEM probe, the electron beam interacts with matter in a controllable manner and physically and chemically transforms amorphous or liquid phase precursor materials into crystalline solids.

The method of the current embodiment also includes controlling the intensity of the electron beam from the STEM probe such that the electron beam impinges the precursor and interacts therewith to physically and chemically transform the precursor material into a crystalline oxide nanostructure having an atomically precise size and shape. The intensity of the electron beam is greater in patterned areas (providing a higher electron dose) than in non-patterned areas. The electron dose in patterned areas is generally several orders of magnitude greater than the electron dose in non-patterned areas. Optionally, the electron dose in patterned areas can be two orders of magnitude greater than the electron dose in non-patterned areas, further optionally three orders of magnitude greater than the electron dose in non-patterned areas, still further optionally four orders of magnitude greater than the electron dose in non-patterned areas. By non-limiting example, the electron dose in patterned areas of a SrTiO$_3$ precursor is $1\times10^7$ e/Å$^2$ and the electron dose in non-patterned areas of a SrTiO$_3$ precursor is $6\times10^3$ e/Å$^2$.

In the current embodiment, nanofabrication of a crystalline structure is achieved with the epitaxial growth of crystalline SrTiO$_3$ from the amorphous SrTiO$_3$ interface; that is, the interface between the amorphous SrTiO$_3$ precursor and the crystalline SrTiO$_3$ substrate. As noted above, however, liquid state nanofabrication is also possible. For example, as the result of electron beam induced radiolysis, solvated electrons are generated of which are highly reducing. The solvated electrons chemically reduce metallic palladium from the H$_2$PdCl$_4$ growth solution and through precise control of the STEM probe crystalline structures are formed.

The forming of patterned areas of a sample material can additionally include the collection of Z-contrast signals and/or EELS spectra. The collection of Z-contrast signals and/or EELS spectra can be performed concurrently with the application of the electron beam to provide real time feedback regarding the formation of crystalline structures at the nanometer level. In one example, an electron beam was slowly scanned across a line connecting the amorphous and crystalline phases, while a Z-contrast signal and EELS spectra were collected. As illustrated in FIG. 1, this process leads to the controlled growth of a 'nanowire' of the crystalline SrTiO$_3$ phase in the previously amorphous area in epitaxial registry with the crystalline substrate. Repeated slow scanning leads to progressive growth of the epitaxial crystalline segment in the amorphous phase. Crystallization proceeds only at the preexisting crystalline interface, while application of the beam in the amorphous region does not produce crystallization. Hence, the process is an electron-beam-induced solid phase epitaxial (SPE) growth at the nanoscale.

The resulting feature looks roughly conical, with a width of 5-6 nm at the base and >2 nm at the tip. Notably, the very end of the tip shows increased brightness in the HAADF image but shows no crystallinity. This behavior provides insight into the nanowire growth mechanism that can be revealed by close examination of the image intensities in the amorphous and crystalline areas. For typical sample thicknesses (≥50 nm), total HAADF image intensities for amorphous and crystalline materials of the same density should be comparable; indeed a multislice simulation shows only 2.5% difference for 50 nm thick SrTiO$_3$. In experimental images, however, the total intensity of the amorphous areas is about 75% of that of the crystalline areas, while it is about 100% for newly grown crystal, suggesting that growth is preceded by diffusion. Thus, the proximity of the crystalline surface in the early stages of growth allows growth of a thicker structure, while as the growth zone is moved farther away, the diffusion slows down. This effect can be compensated for by scanning progressively slower as the growth zone gets further away from the crystalline substrate.

Figure 2:
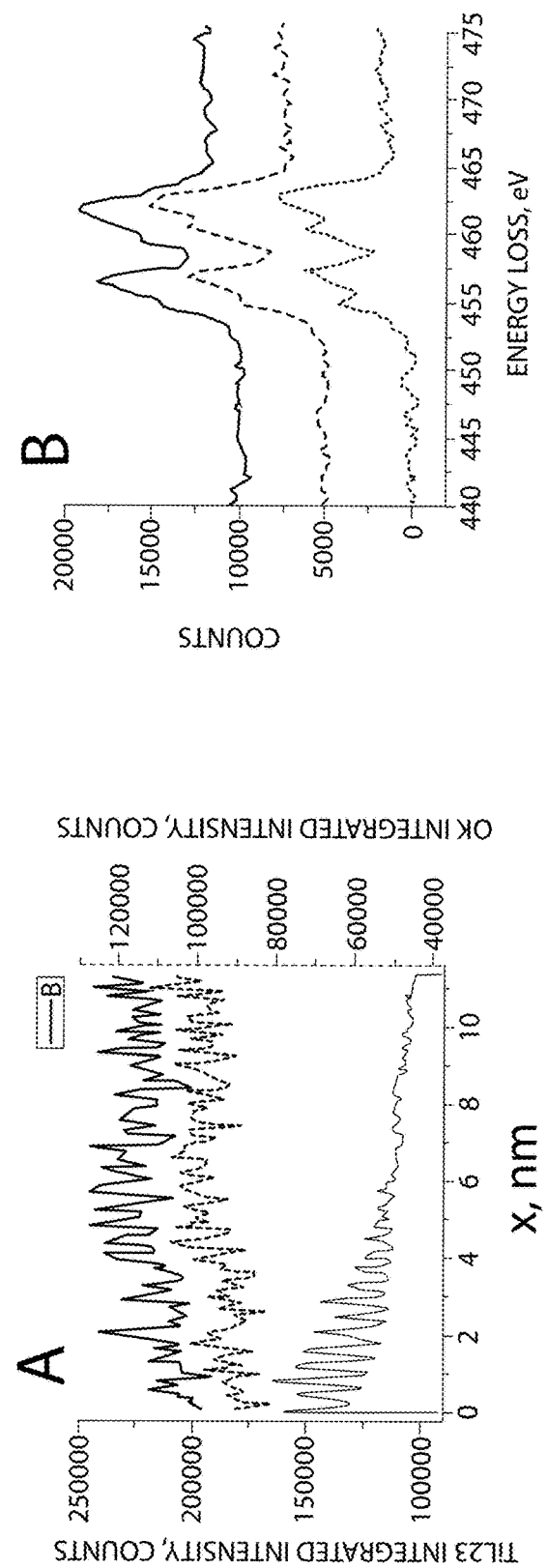
FIG. 2 includes graphs depicting EELS data collected during SrTiO$_3$ nanowire growth, including integrated intensities of Ti L (dotted curve) and O K (dashed curve) edges in part A and evolution of the fine structure of the Ti L edge during growth in part B.

Further support for the diffusion-limited character of the observed growth can be derived from the simultaneously collected EELS data. FIG. 2 (part A) shows compositional profiles for the scan along the line in FIG. 1. The corresponding HAADF profile shows the transition from an aligned crystal to an amorphous material as the wire grows. Integrated intensities for Ti L and O K edges demonstrate identical behavior, with a slight increase in intensity for the amorphous area reflecting deceased thickness, indicating that the composition of both the crystalline and amorphous areas of the wire remain the same. FIG. 2 (part B) shows the evolution of the fine structure of the Ti L edge for the different areas of the wire. At the base of the wire (solid line), crystal field splitting is evidence in both L3 and L2 peaks. In the thinner crystalline part of the wire (dashed line), the splitting is less apparent, and finally at the amorphous tip (dotted curve) the splitting is no longer evident, indicating progressively decreasing contribution of the crystalline phase to the single, consistent with a conical shape of a growing crystal.

To summarize, the current embodiments include an atomically focused STEM beam that can be used to induce directed crystallization of an amorphous or liquid phase. Combined with electron beam path control, this approach can be used for atomic-level sculpting of crystalline oxides, allowing fabrication of elaborate 3D epitaxial crystalline features as small as 1-2 nm.

II. EXAMPLES

Figure 3:
FIG. 3 is a scanning electron microscope image of nanofabrication of the text "ORNL" from an amorphous SrTiO$_3$ precursor with a 10 nm scale bar.

A crystalline oxide nanostructure was sculpted from an amorphous precursor in the following example, which is non-limiting. A heterostructure of $SrTiO_3/LaAlO_3/SrTiO_3$ was prepared according to an ion milling process and a substrate material was redeposited on the top $SrTiO_3$ structure in an amorphous form. Using a 300 pA probe current with a controlled scan speed and trajectory, an epitaxial nanostructure was created by exposing patterned areas to a much higher electron dose (with 1 ms pixel$^{-1}$ and 0.16 Å$^2$ pixel size, total electron dose of $1\times10^7$ e/Å$^2$) than non-patterned areas (with 0.5 μs pixel$^{-1}$ and 0.16 Å$^2$ pixel size, total electron dose of $6\times10^3$ e/Å$^2$). The nanostructure included the text "ORNL," which was patterned onto a previously amorphous region of $SrTiO_3$ as shown in FIG. 3, demonstrating that legible text can be produced with letters about 20 nm high.

Figure 4:
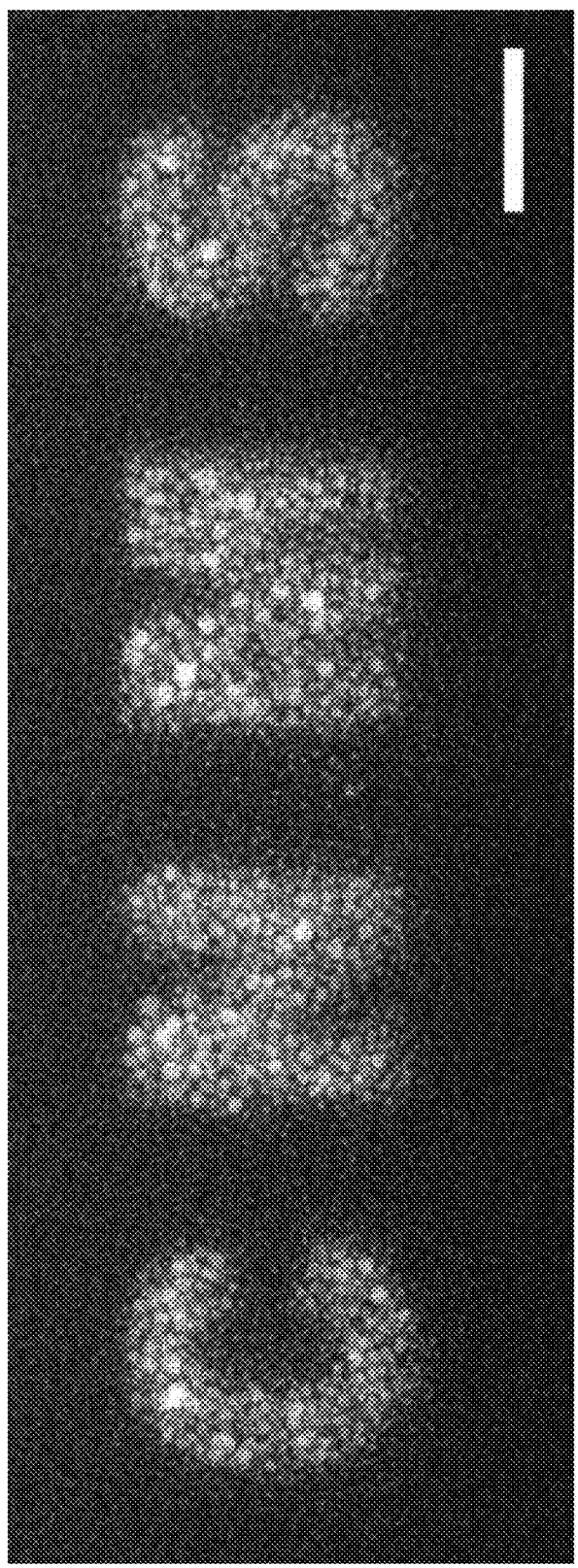
FIG. 4 is a scanning electron microscope image of nanofabrication of the text "CNMS" from a liquid phase H$_2$PdCl$_4$ growth solution with a 500 nm scale bar.

A crystalline oxide nanostructure was sculpted from a liquid precursor in the following example, which is non-limiting. A growth solution of $H_2PdCl_4$ was encapsulated between two electron-transparent silicon nitride membranes and placed in an in situ liquid cell STEM holder. As a result of electron beam induced radiolysis, solvated electrons are generated of which are highly reducing. The solvated electrons chemically reduce metallic Pd from the $H_2PdCl_4$ growth solution and through precise control of the STEM probe a crystalline nanostructure was formed. The nanostructure included the text "CNMS" as shown in FIG. 4, with a 500 nm scale bar.

The above description is that of current embodiments of the invention. Various alterations and changes can be made without departing from the spirit and broader aspects of the invention as defined in the appended claims, which are to be interpreted in accordance with the principles of patent law including the doctrine of equivalents. This disclosure is presented for illustrative purposes and should not be interpreted as an exhaustive description of all embodiments of the invention or to limit the scope of the claims to the specific elements illustrated or described in connection with these embodiments. The present invention is not limited to only those embodiments that include all of these features or that provide all of the stated benefits, except to the extent otherwise expressly set forth in the issued claims. Any reference to claim elements in the singular, for example, using the articles "a," "an," "the" or "said," is not to be construed as limiting the element to the singular.

REFERENCES

1. D. M. Eigler & E. K. Schweizer, "Positioning single atoms with a scanning tunneling microscope," *Nature* 344, 524-526 (1990).
2. M. F. Crommie, C. P. Lutz & D. M Eigler, "Confinement of electrons to quantum corrals on a metal surface," *Science* 262, 218-220 (1993).
3. M. F. Crommie, C. P. Lutz & D. M Eigler, "Imaging standing waves in a two-dimensional electron gas," *Nature* 363, 524-527 (1993).
4. D. M. Eigler, C. P. Lutz & W. E. Rudge, "An atomic switch realized with the scanning tunneling microscope," *Nature* 352, 600-603 (1991).
5. A. J. Heinrich, C. P. Lutz, J. A. Gupta & D. M. Eigler, "Molecule cascades," *Science* 298, 1381-1387 (2002).
6. C. R. Moon, C. P. Lutz & H. C. Manoharan, "Single atom gating of quantum-state superpositions," *Nature Physics* 4, 454-458 2008).
7. O. Custance, R. Perez & S. Morita, "Atomic force microscopy as a tool for atom manipulation," *Nature Nanotechnology* 4, 803-810 (2009).
8. Y. Sugimoto, M. Abe, S. Hirayama, N. Oyabu, O. Custance & S. Morita, "Atom inlays performed at room temperature using atomic force microscopy," *Nature Materials* 4, 156-159 (2005).
9. C. Vieu, F. Carcenac, A. Pepin, Y. Chen, M. Mejias, A. Lebib, L. Manin-Ferlazzo, L. Couraud & H. Launois, "Electron beam lithography: resolution and limits," *Applied Surface Science* 164, 111-117 (2000).
10. D. B. Williams & C. B. Carter, *Transmission Electron Microscopy: a Textbook for Materials Science* (Springer, New York, 2004).
11. K. Zheng, C. Wang, Y. Q. Cheng, Y. Yue, X. Han, Z. Zhang, Z. Shan, S. X. Mao, M. Ye, Y. Yin & E. Ma, "Electron-beam-assisted superplastic shaping of nanoscale amorphous silica," *Nature Communications* 1, 24 (2010).

The invention claimed is:

1. A method of fabricating a crystalline oxide nanostructure comprising:
   providing a scanning transmission electron microscope for generating a scanning electron beam;
   positioning a sample including an amorphous oxide precursor material on a crystalline substrate within a sample area of the scanning transmission electron microscope; and
   activating the scanning transmission electron microscope such that the scanning electron beam impinges the sample in a region of the precursor material and physically and chemically transforms the precursor material into an epitaxially grown crystalline oxide nanostructure.

2. The method according to claim 1 further including varying an intensity of the scanning electron beam such that the sample includes a patterned area and a non-patterned area, the patterned area receiving a higher electron dose than the non-patterned area.

3. The method according to claim 1 wherein activating the scanning transmission electron microscope includes repeated scans of the scanning electron beam to achieve progressive epitaxial growth of the crystalline oxide nanostructure with each scan of the scanning electron beam.

4. The method according to claim 3 further including slowing a scan rate of the scanning electron beam between scans of the scanning electron beam.

5. The method according to claim 1 further including scanning the sample with electron energy loss spectroscopy concurrently with the activation of the scanning transmission electron microscope.

6. The method according to claim 1 wherein the amorphous oxide precursor material and the crystalline substrate are identical oxides.

7. The method according to claim 1 wherein the amorphous oxide precursor material is an alkaline earth metal oxide.

8. The method according to claim 1 wherein the amorphous oxide precursor material is strontium titanate.

9. The method according to claim 1 further including applying a DC bias to scanning coils of the scanning transmission electron microscope.

10. A method of forming a nanostructure comprising:
selecting an amorphous oxide precursor material;
applying the oxide precursor material to a crystalline substrate to form a precursor layer;
positioning a scanning transmission electron microscope probe over the precursor layer; and
irradiating the precursor material with an electron beam from the scanning transmission electron microscope probe such that the electron beam impinges the precursor material and physically and chemically transforms the precursor material into an epitaxially grown crystalline oxide nanostructure.

11. The method according to claim 10 further including applying a DC bias to scanning coils of the scanning transmission electron microscope probe to control a location, a dwell time, and a raster speed of the electron beam.

12. The method according to claim 10 wherein said irradiating the precursor material with an electron beam includes repeated scans of the electron beam to achieve progressive epitaxial growth of the crystalline oxide nanostructure with each scan of the electron beam.

13. The method according to claim 12 further including slowing a scan rate of the electron beam between scans of the electron beam.

14. The method according to claim 10 further including scanning the precursor material with electron energy loss spectroscopy concurrently with each electron beam scan.

15. The method according to claim 10 wherein the amorphous oxide precursor material is an alkaline earth metal oxide.

* * * * *